(12) United States Patent
Sukekawa

(10) Patent No.: US 8,093,642 B2
(45) Date of Patent: Jan. 10, 2012

(54) SEMICONDUCTOR MEMORY DEVICE AND METHOD OF MANUFACTURING THE SAME

(75) Inventor: Mitsunari Sukekawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 13 days.

(21) Appl. No.: 12/421,049

(22) Filed: Apr. 9, 2009

(65) Prior Publication Data

US 2009/0256182 A1 Oct. 15, 2009

(30) Foreign Application Priority Data

Apr. 10, 2008 (JP) ................................ 2008-102556

(51) Int. Cl.
*H01L 27/108* (2006.01)
(52) U.S. Cl. ......... 257/306; 257/296; 257/303; 257/300
(58) Field of Classification Search .................. 257/296, 257/306, 303, 300
See application file for complete search history.

(56) References Cited

FOREIGN PATENT DOCUMENTS

| JP | 2000-196038 | | 7/2000 |
|---|---|---|---|
| JP | 2000-332216 | | 11/2000 |
| JP | 2001-217406 | | 8/2001 |
| JP | 2003-179163 | | 6/2003 |
| JP | 2004-014714 | | 1/2004 |
| JP | 2003170163 | * | 9/2004 |
| JP | 2006-319315 | | 11/2006 |
| WO | WO97/19468 | | 5/1997 |

* cited by examiner

*Primary Examiner* — Long Pham
(74) *Attorney, Agent, or Firm* — Young & Thompson

(57) ABSTRACT

A semiconductor memory device includes a memory cell portion and a peripheral circuit portion. The memory cell portion includes a pillar capacitor with a lower electrode, a dielectric film, and an upper electrode sequentially formed on a side surface of a first insulating portion which is parallel to a predetermined direction, and a transistor electrically connected to the lower electrode. The peripheral circuit portion includes a plate electrode, a cylinder capacitor with an upper electrode, a dielectric film, and a lower electrode sequentially formed on a side surface of the plate electrode which is parallel to the predetermined direction, and a transistor electrically connected to the lower electrode.

9 Claims, 8 Drawing Sheets

FIG. 1A Memory cell portion forming region / Boundary forming region / Peripheral circuit portion forming region Memory cell portion forming region | Boundary forming region | Peripheral circuit portion forming region

SEMICONDUCTOR MEMORY DEVICE AND METHOD OF MANUFACTURING THE SAME

BACKGROUND OF THE INVENTION

1. Field of the Invention

The present invention relates to a semiconductor memory device and a method of manufacturing the semiconductor memory device.

2. Description of the Related Art

A DRAM (Dynamic Random Access Memory) is composed of memory cells each made up of a transistor and a capacitor. The capacitor is composed of a lower electrode, a dielectric film, and an upper electrode. In recent years, with advanced semiconductor miniaturizing techniques, ensuring a required area for electrodes in the DRAM has been difficult.

Thus, to increase the area for the electrodes, Japanese Patent Laid-Open No. 2001-217406 discloses a technique of using an inner wall and an outer wall formed like crowns as an upper electrode and a lower electrode, respectively, to increase capacity. FIG. 11 shows a recessed lower electrode similar to the lower electrode in Japanese Patent Laid-Open No. 2001-217406.

In FIG. 11, the lower electrode is denoted by 105. The lower electrode in FIG. 11 is formed as follows. First, a transistor and a contact plug are formed such that the contact plug is electrically connected to one of a source region and a drain region of the transistor. Thereafter, an interlayer insulating film is formed all over the resulting surface A mask pattern is then formed on a portion of the interlayer insulating film which is located on a region forming a memory cell portion.

Thereafter, by performing wet etching, the interlayer insulating film is removed except for the portion of the interlayer insulating film which is located under the mask pattern, to form an opening. A conductive material is then deposited on an inner wall of the opening to form a tower electrode. The interlayer insulating film is then removed. At this time, the internal surface (the interior of the recessed structure) of the lower electrode is exposed.

Efforts have been made to develop a method of preventing formation of a step between the memory cell portion and the peripheral circuit portion, Japanese Patent Laid-Open No. 2001-217406 and WO 97/019468 disclose methods of reducing a step that may be formed at the boundary between the memory cell portion and the peripheral circuit portion.

SUMMARY OF THE INVENTION

In one embodiment, there is provided a semiconductor memory device including a memory cell portion and a peripheral circuit portion, wherein the memory cell portion comprises.

a first insulating portion extending in a predetermined direction;

a capacitor including a lower electrode, a dielectric film, and an upper electrode sequentially formed on a side surface of the first insulating portion which is parallel to the predetermined direction;

a plate electrode electrically connected to the upper electrode; and a transistor including a source region and a drain region one of which is electrically connected to the lower electrode, and the peripheral circuit portion comprises:

a plate electrode extending in the same direction as the predetermined direction;

a capacitor including an upper electrode, a dielectric film, and a lower electrode sequentially formed on a side surface of the plate electrode which is parallel to the predetermined direction; and a transistor including a source region and a drain region one of which is electrically connected to the lower electrode.

In another embodiment, there is provided a method of manufacturing a semiconductor memory device, the method comprising:

forming a transistor and a contact plug in a memory cell portion forming region and a peripheral circuit portion forming region, the contact plug being electrically connected to one of a source region and a drain region of the transistor;

depositing an interlayer insulating film all over the memory cell portion forming region and the peripheral circuit portion forming region;

forming a plurality of first openings in the interlayer insulating film in the memory cell portion forming region such that the contact plug is exposed, and forming a second opening in the interlayer insulating film in the peripheral circuit portion forming region so as to enclose a predetermined region and to expose the contact plug;

depositing a conductive material on an inner wall of each of the first and second openings so as to leave an opening portion unfilled, to form a lower electrode;

filling an insulating material in each of the first openings with the lower electrode formed therein, to form a first insulating portion, and filling an insulating material into the second opening with the lower electrode formed therein;

removing the interlayer insulating film from the memory cell portion forming region and removing the interlayer insulating film composing the predetermined region in the peripheral circuit portion forming region to form a third opening;

depositing a dielectric film so as to cover a surface of the lower electrode in the memory cell portion forming region with the dielectric film and to cover an inner wall of the third opening in the peripheral circuit portion forming region with the dielectric film;

filling a conductive material, in the memory cell portion forming region, between the first insulating portions each formed with the dielectric film and the lower electrode, to form an upper electrode, and depositing a conductive material in the third opening so as to leave an opening portion unfilled in the peripheral circuit portion forming region to form an upper electrode; and forming a plate electrode in the memory cell portion forming region such that the plate electrode is electrically connected to the upper electrode, and filling a conductive material into the opening portion of the third opening in the peripheral circuit portion forming region to form a plate electrode.

In another embodiment, there is provided a semiconductor memory device comprising:

a memory cell portion including a plurality of first capacitors, each of the first capacitors including a first lower electrode formed along a first insulating wall, a first upper electrode, and a first dielectric film formed between the first lower electrode and the first upper electrode; and a peripheral circuit portion including at least one second capacitor, the second capacitor including a second lower electrode formed along a second insulating wall, a second upper electrode, and a second dielectric film formed between the second lower electrode and the second upper electrode.

BRIEF DESCRIPTION OF THE DRAWINGS

The above features and advantages of the present invention will be more apparent from the following description of certain preferred embodiments taken in conjunction with the accompanying drawings, in which.

Figure 1B:
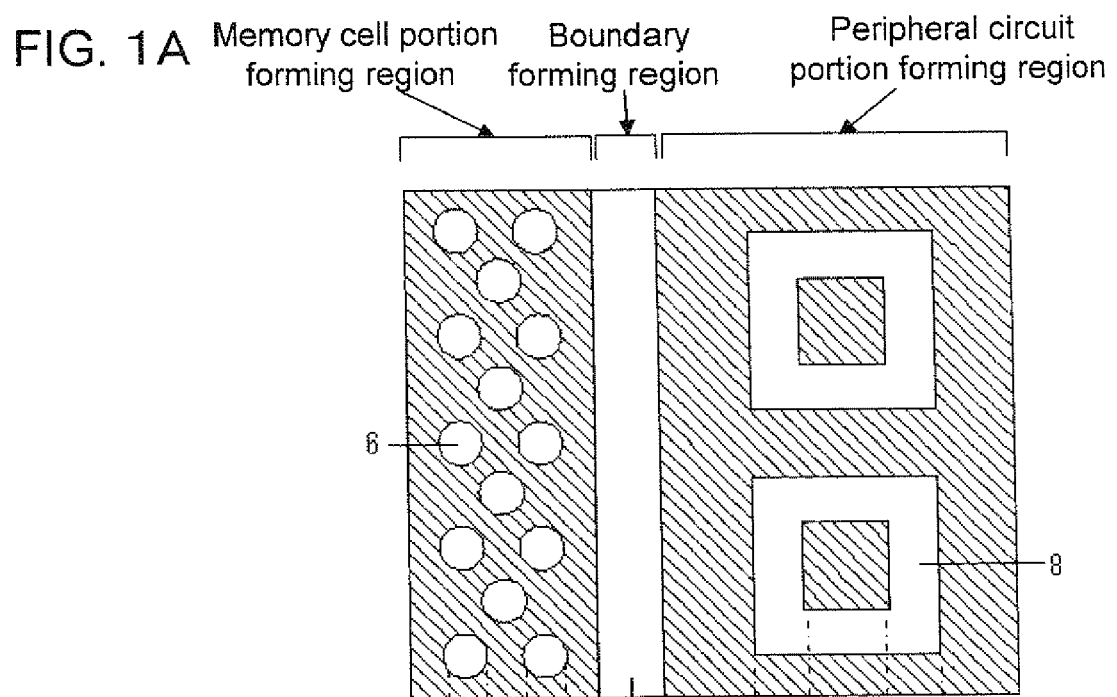
FIG. 1 is a diagram showing a step of an example of a method of manufacturing a semiconductor memory device according to the present invention.

In the drawings, numerals have the following meanings. 1: interlayer insulating film, 2: tungsten plug, 3: silicon nitride film, 4: interlayer insulating film, 5: photo resist, 6: capacitance pattern, 7: groove pattern, 8: capacitance pattern, 9: capacitive lower electrode TiN film, 10: silicon nitride film, 11: photo resist, 12: memory cell portion wet cutting pattern, 13: peripheral circuit portion wet cutting pattern, 14: peripheral circuit portion capacitive lower electrode, 15: capacitive film, 16: capacitive upper electrode, 17: capacitive plate electrode, 18: photo resist, 19: capacitive electrode pattern, 23: first opening, 24: second opening, 26: predetermined region, 27: third opening, 101: interlayer insulating film, 102: tungsten plug, 103: silicon nitride film, 104: interlayer insulating film, 105: capacitive lower electrode, 106: wet damage, 107: pattern collapse, 200: silicon substrate.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 10A:
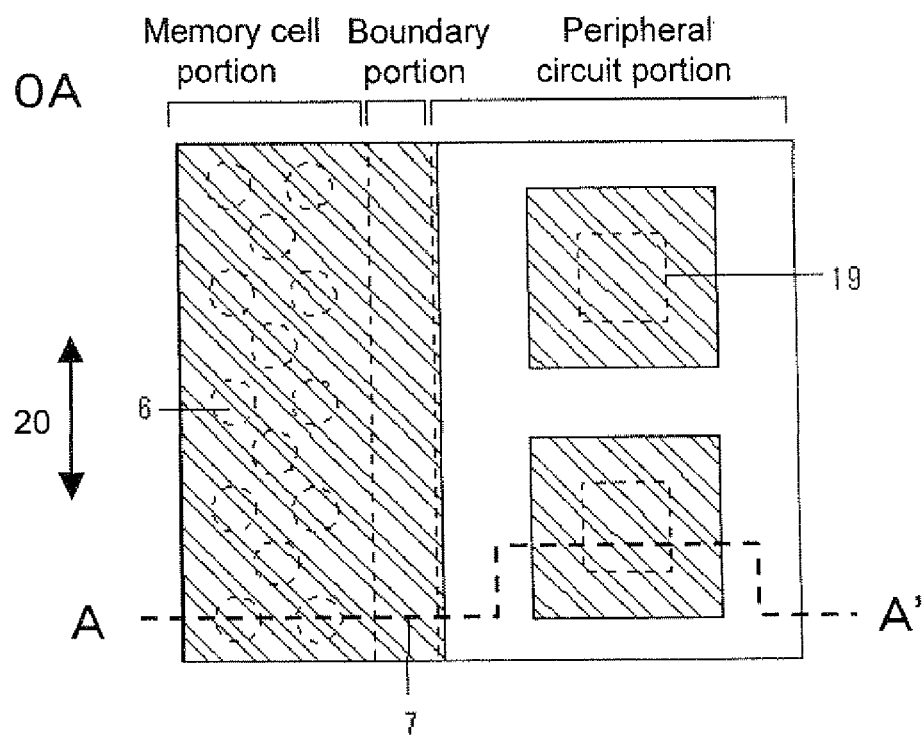
FIG. 10 is a diagram showing a step of the example of the method of manufacturing the semiconductor memory device according to the present invention.
Figure 10B:
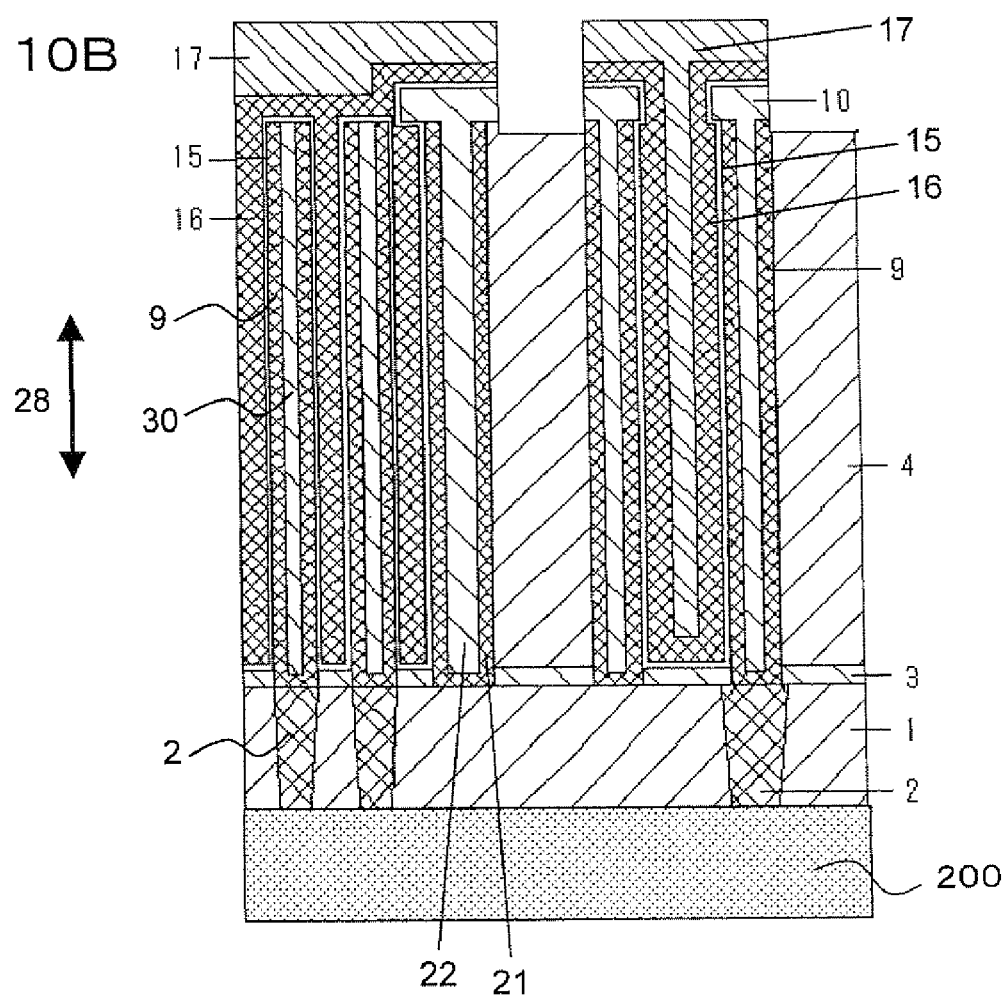
Figure 11:
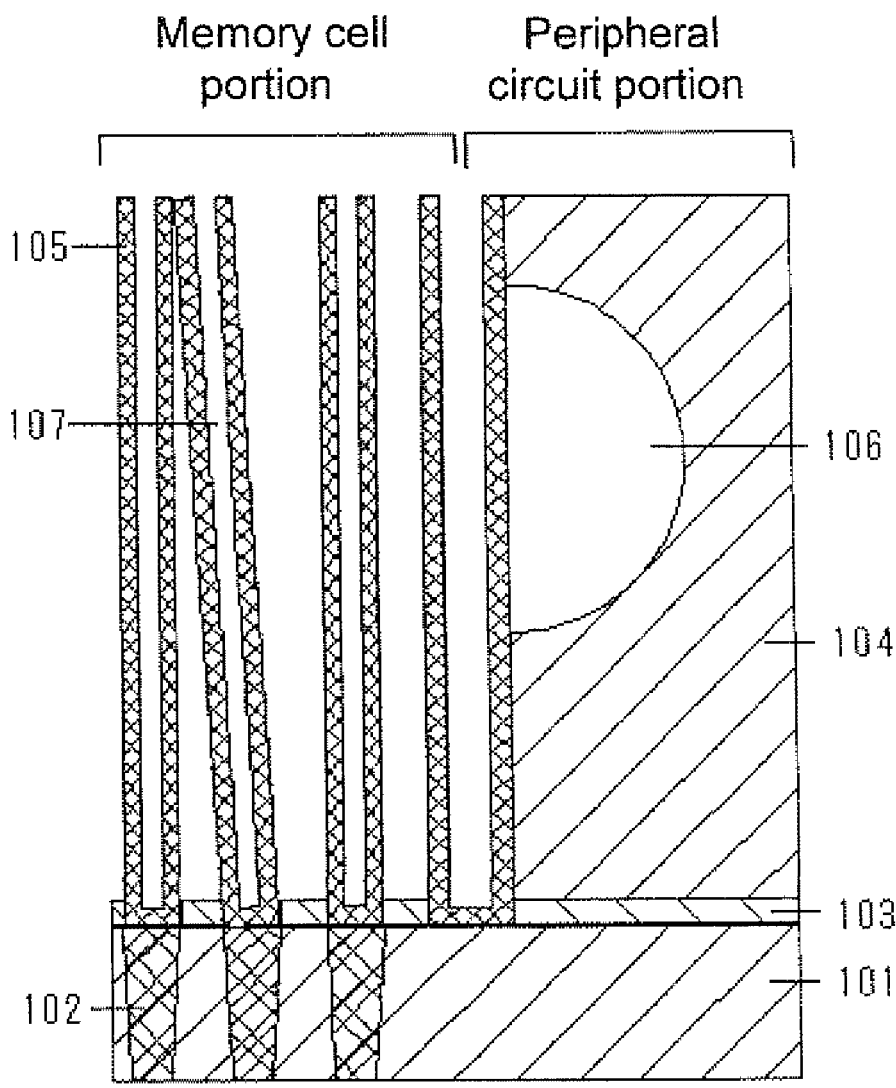
FIG. 11 is a diagram showing a related semiconductor memory device.

FIG. 10 is a diagram showing an example of a semiconductor memory device including a DRAM. FIG. 10A is a top view of a semiconductor memory device. FIG. 10B is a sectional view of the semiconductor memory device taken along direction A-A in FIG. 10A. The semiconductor memory device in the present example includes a transistor electrically connected to a capacitor. However, in FIG. 10, the transistor is omitted.

As shown in FIG. 10A, the left side, in the figure, of the semiconductor memory device in the present example corresponds to a memory cell portion. The right side corresponds to a peripheral circuit portion. Dummy groove pattern 7 is formed at the boundary between the memory cell portion and the peripheral circuit portion so as to enclose the memory cell portion. Dummy groove pattern 7 forms a boundary portion.

A plurality of pillar capacitors 6 are formed in the memory cell portion. As shown in FIG. 10B, each of capacitors 6 is composed of first insulating portion 30 extending in predetermined direction 28, and lower electrode 91 dielectric film 15, and upper electrode 16 sequentially formed on a side surface of the first insulating portion which is parallel to predetermined direction 28, and plate electrode 17 electrically connected to upper electrode 16. The first insulating portion is shaped like a pillar. The pillar shape of the first insulating portion allows dielectric film 15 and upper electrode 16 to be easily formed on the side surface thereof. The pillar shape also enables an increase in the contact area between the first insulating portion and dielectric film 15.

A plurality of first insulating portions 30 each with lower electrode 9, dielectric film 15, and upper electrode 16 sequentially formed on the side surface thereof are arranged at regular intervals in particular direction 20. A plurality of first insulating portions 30 compose array of first insulating portions 30. The memory cell portion has a plurality of arrays of first insulating portions 30. The adjacent arrays are arranged such that the first insulating portions in one array are staggered with respect to the first insulating portions in the other array. A conductive material is filled between the first insulating portions each with the lower electrode and the dielectric film formed on the side surface thereof to make up upper electrode 16. Arranging the first insulating portions in this manner allows the capacitors to be formed at a high density per unit area. This allows for refinement.

Furthermore, one of a source region and a drain region of a transistor (not shown in the FIGS) is electrically connected to lower electrode 9. The transistor may be a planar-type transistor or a Fin-type transistor. A semiconductor substrate 200 is formed under the lower electrode 9. One transistor and one capacitor make up one memory cell in a DRAM (Dynamic Random Access memory). In the DRAM, information can be stored in capacitor 6 by expressing a state in which charge is accumulated and a state in which no charge is accumulated, as two values.

The peripheral circuit portion includes at least one cylinder capacitor. FIG. 10A shows an example in which the peripheral circuit portion includes two capacitors. Each of the capacitors includes plate electrode 17 extending in the same direction as predetermined direction 28, and upper electrode 16, dielectric film 15, and lower electrode 9 sequentially formed on a side surface of plate electrode 17 which is parallel to predetermined direction 28. The capacitors and transistors in the peripheral circuit portion can be used as, for example, a miniaturized voltage compensating circuit for stabilizing voltage.

Plate electrode 17 is shaped like a rectangular parallelepiped. The rectangular parallelepipedic shape of plate electrode 17 allows the areas of upper electrode 16 and lower electrode 9 to be increased, while ensuring sufficient miniaturization. Furthermore, lower electrode 9 is formed on an inner wall of an opening formed so as to cover dielectric film 15. Lower electrode 9 makes up a recessed structure. A part of lower electrode 9 is in contact with dielectric film 15. Insulating material 10 is filled in the recessed structure making up the lower electrode. Moreover, one of the source and drain regions of the transistor (not shown in the FIGS) is electrically connected to lower electrode 9. The transistor may be a planar-type transistor or a Fin-type transistor. A semiconductor substrate 200 is formed under the lower electrode 9.

Boundary portion 7 is formed between the memory cell portion and the peripheral circuit portion. Boundary portion 7 includes conductive material film 21 formed on an inner wall of an opening extending in the same direction as predetermined direction 28, and second insulating portion 22 filled in the opening.

A constituent material for the first insulating portion of the memory cell portion, insulating material 10 of the peripheral circuit portion, and the second insulating portion of the boundary portion is not particularly limited provided that the material offers an insulating property. However, silicon nitride is preferably used. A constituent material for upper electrode 16 and lower electrode 9 in the memory cell portion and peripheral circuit portion is not particularly limited provided that the material is conductive. However, TiN is preferably used.

Thus, in the semiconductor memory device in the present example, the pillar capacitor is formed in the memory cell portion. The cylinder capacitor is formed in the peripheral circuit portion. In the memory cell portion and the peripheral circuit portion, after lower electrode 9 is formed, insulating material 10 is filled inside lower electrode 9 (the interior of the recessed structure). This enables problems that may occur during the subsequent steps to be avoided: for example, during wet etching, an etchant may permeate the inside of lower electrode 9 to etch an unexpected region. As a result, the memory cell portion and the peripheral circuit portion can be prevented from being improperly formed.

Furthermore, the first insulating portion is present inside the lower electrode of the memory cell portion. Thus, the first insulating portion serves as a support to improve the strength of the lower electrode. As s result, the lower electrode can be prevented from being collapsed. Moreover, in the peripheral circuit portion, the lower electrode, the dielectric film, and the upper electrode are sequentially formed on the side surface of the plate electrode. This enables an increase in the areas of the lower and upper electrodes, while enabling a reduction in the area occupied by the capacitor to ensure sufficient miniaturization.

Now, with reference to FIGS. 1 to 10, an example of a method of manufacturing a semiconductor memory device according to the present exemplary embodiment will be described.

Figure 1B:
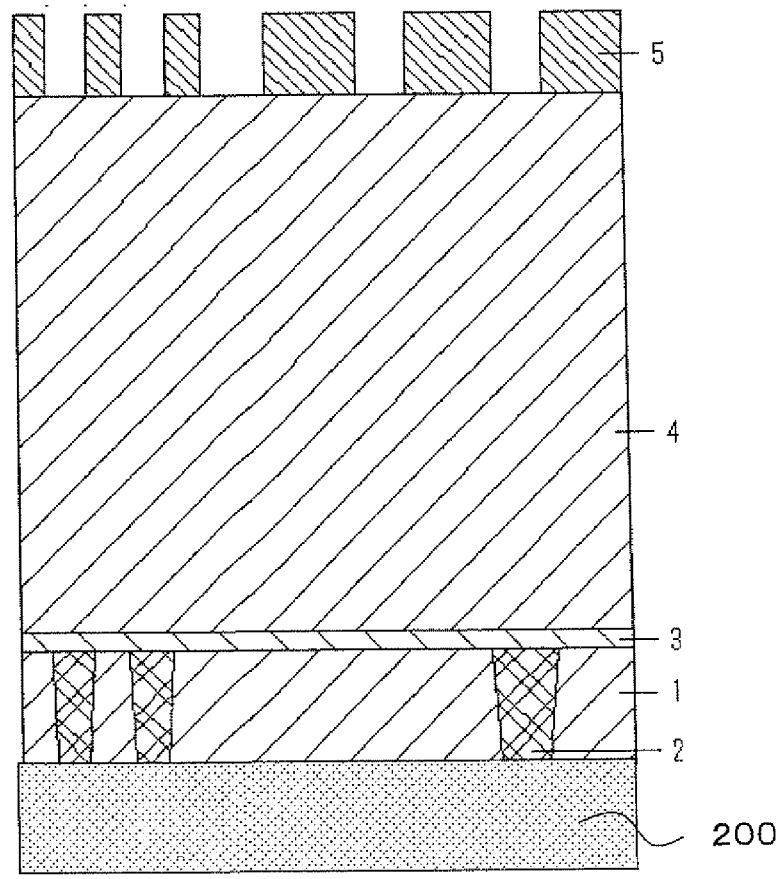

First, a transistor (not shown in the FIGS) was formed in a memory cell portion forming region and a peripheral circuit portion forming region. Then, interlayer insulating film 1 was formed all over the resulting surface. Then, as shown in FIG. 1, a semiconductor substrate was prepared. The contact plugs 2 were formed in interlayer insulating film 1 so as to be electrically connected to one of the source and drain regions of the transistor. Silicon nitride film 3 was then deposited to a thickness of 30 nm to 100 nm by an LP-CVD method. Silicon oxide film 4 was deposited to a thickness of 0.5 μm to 1.5 μm as an interlayer insulating film by a plasma CVD method. A photo resist was then formed on silicon oxide film 4. Photo resist pattern 5 was thereafter formed using a lithography method.

Figure 2:
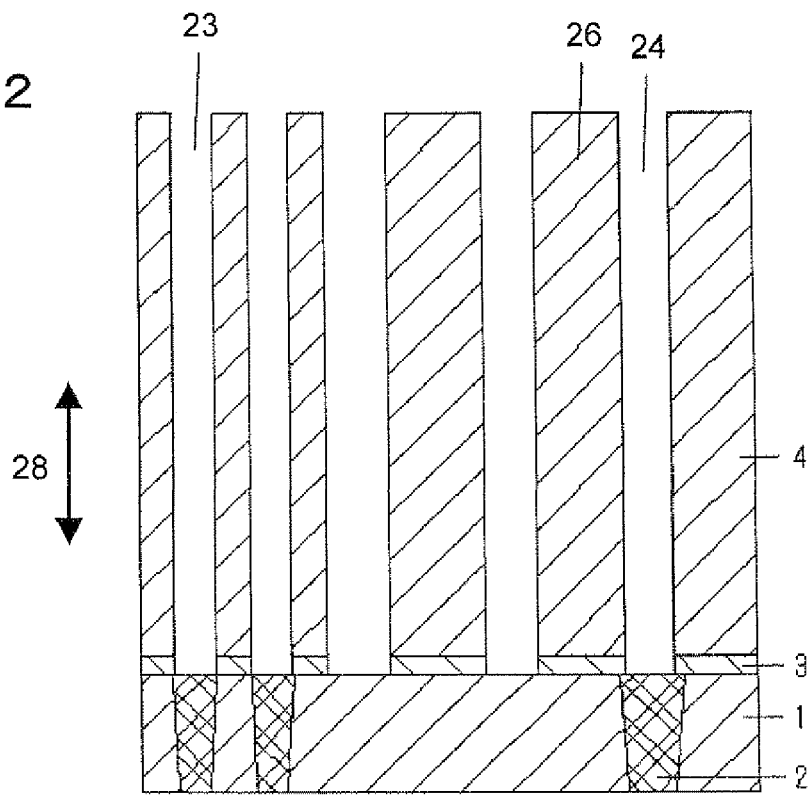
FIG. 2 is a diagram showing a step of the example of the method of manufacturing the semiconductor memory device according to the present invention.

Then, as shown in FIG. 2, a plasma dry etching technique was used to form a plurality of cylindrical first openings 23 in interlayer insulating film 4 in the memory cell portion forming region through photo resist pattern 5 as a mask so that contact plugs 2 were exposed in interlayer insulating film 4 in the memory cell portion forming region. At this time, the first openings were formed such that a plurality of arrays of the first openings were arranged at regular intervals in a particular direction and such that the first openings in one of the adjacent arrays were staggered with respect to the first openings in the other array. Simultaneously with the formation of the first openings, second opening 24 was formed in interlayer insulating film 4 in the peripheral circuit portion forming region so as to enclose rectangular parallelepipedic predetermined region 26 and to expose the contact plug. In this step, the first and second openings were formed to extend in predetermined direction 28. Thereafter, photo resist pattern 5 was removed.

Figure 3:
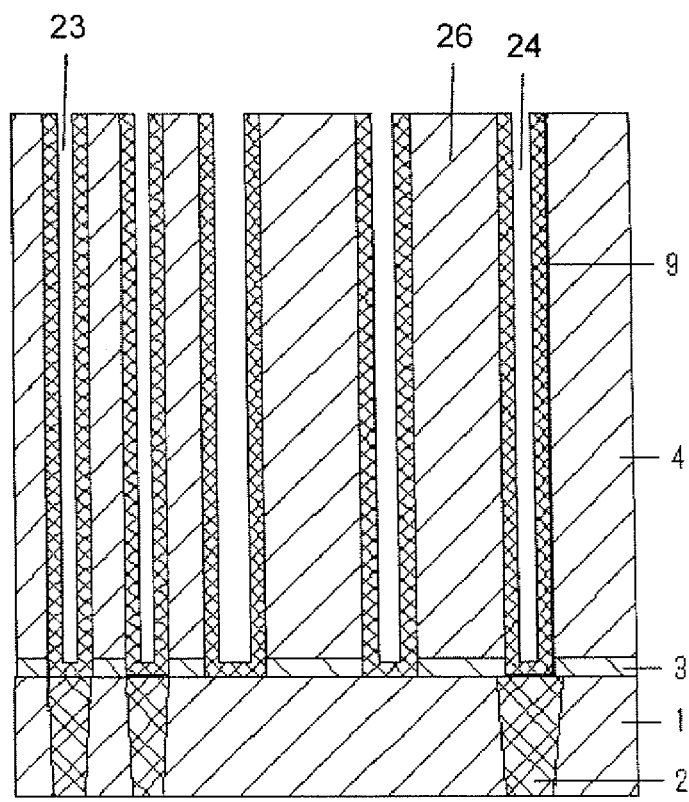
FIG. 3 is a diagram showing a step of the example of the method of manufacturing the semiconductor memory device according to the present invention.

Then, as shown in FIG. 3, TiN film 9 was deposited ail over the resulting surface to a thickness of 5 nm to 30 nm by a thermal CVD method using a TiCl$_4$ gas. At this time, TiN film 9 was formed in each of the first and second openings so as to leave an opening portion unfilled. Thereafter, the TiN film on interlayer insulting film 4 was removed by the dry etching technique to form lower electrode 9 on an inner wall of each of the first and second openings.

Figure 4:
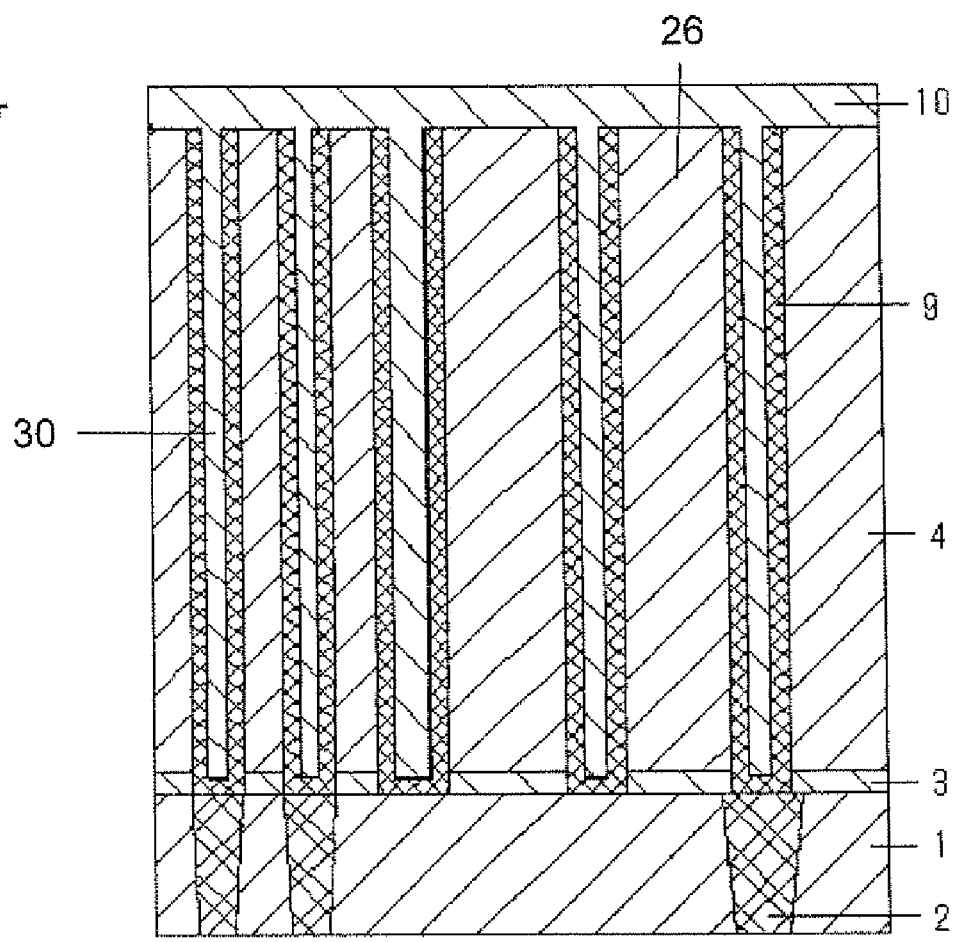
FIG. 4 is a diagram showing a step of the example of the method of manufacturing the semiconductor memory device according to the present invention.

Then, as shown in FIG. 4, silicon nitride film 10 was deposited all over the resulting surface to a thickness of 10 to 50 nm by the LP-CVD method. Silicon nitride 10 was thus buried inside the first and second openings. At this time, first insulating portion 30 was formed in each of the first openings. Then, a photo resist was formed on silicon nitride film 10.

Figure 5A:
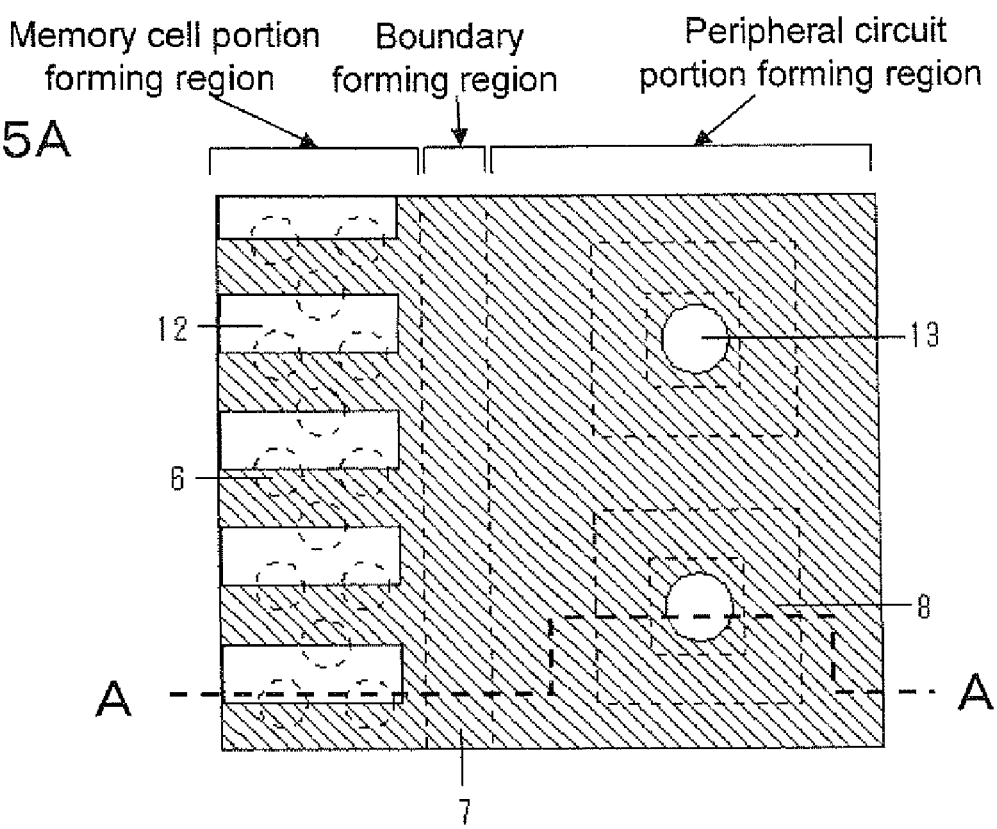
FIG. 5 is a diagram showing a step of the example of the method of manufacturing the semiconductor memory device according to the present invention.
Figure 5B:
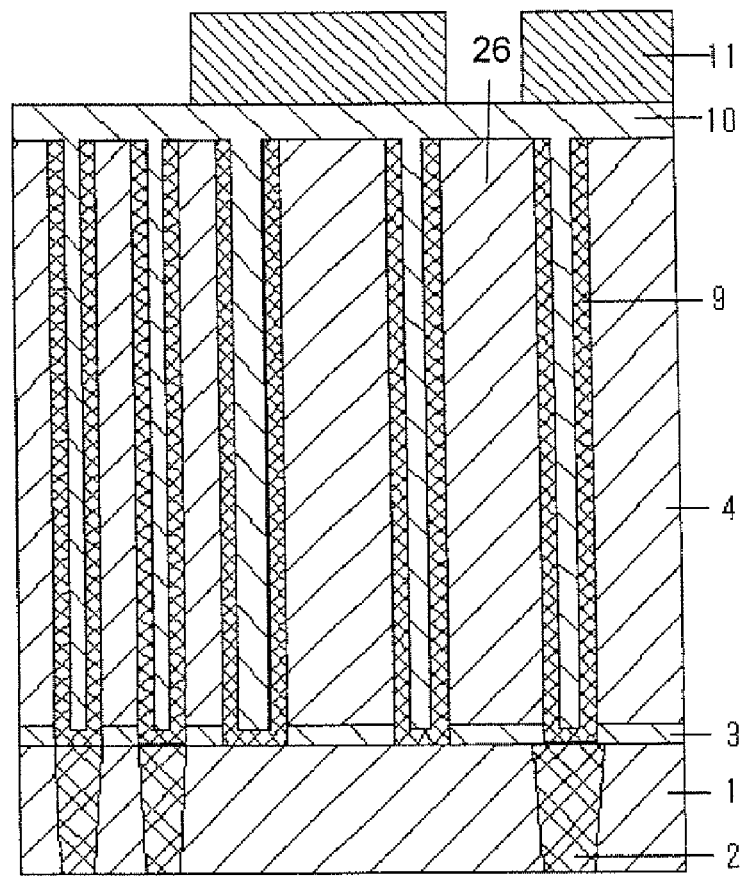

Thereafter, photo resist pattern 11 was formed using the lithography method so that the memory cell portion forming region had cutting pattern 12, whereas the peripheral circuit portion forming region had cutting pattern 13. FIG. 5A is a top view showing this condition. FIG. 5B is a sectional view showing a cross section taken along direction A-A' in FIG. 5A. FIGS. 6 to 9 also show cross sections taken along the direction A-A' in FIG. 5A.

As shown in FIG. 5, the cutting pattern 12 was formed in the peripheral circuit portion forming region. In the subsequent steps the exposed silicon nitride 10 was etched by film thickness thereof using the photo resist pattern 11 as a mask, to form the first insulating portions 30. This etching simultaneously leaved a beam made of the silicon nitride 10 connecting a plurality of capacitors 6 on upper surface of the lower electrode 9 in the memory cell portion forming region. As s result, the capacitor 6 can be prevented from being collapsed when the silicon oxide 4 in the memory cell portion forming region is removed in the subsequent steps.

Figure 6:
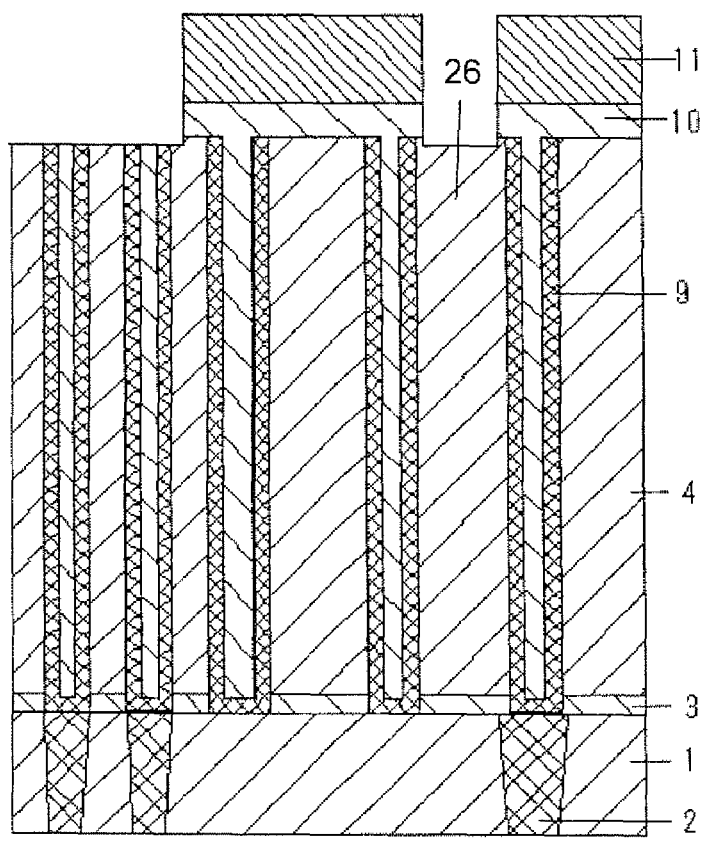
FIG. 6 is a diagram showing a step of the example of the method of manufacturing the semiconductor memory device according to the present invention.

Then, as shown in FIG. 6, silicon nitride film 10 was removed through photo resist pattern 11 as a mask by the plasma dry etching method, to expose silicon oxide film 4.

Figure 7:
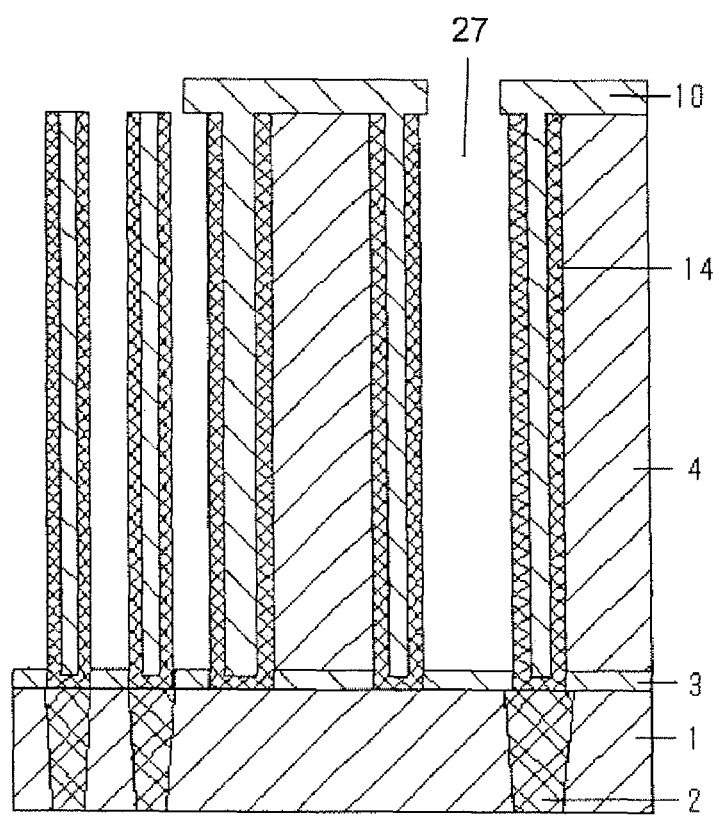
FIG. 7 is a diagram showing a step of the example of the method of manufacturing the semiconductor memory device according to the present invention.

Thereafter, as shown in FIG. 7, wet etching using a diluted hydrofluoric acid was performed, which exhibits a higher etching rate for silicon oxide film 4 than for silicon nitride film 10. That is, in the memory cell portion forming region, silicon oxide film 4 was removed. In the peripheral circuit portion forming region, silicon oxide film 4 making up predetermined region 26 was removed to form a third opening (reference numeral 27). As a result, in the memory cell portion forming region, an outer wall of each of lower electrodes 9 was exposed. In the peripheral circuit portion forming region, the third opening enclosed by lower electrodes 9 was exposed.

Figure 8:
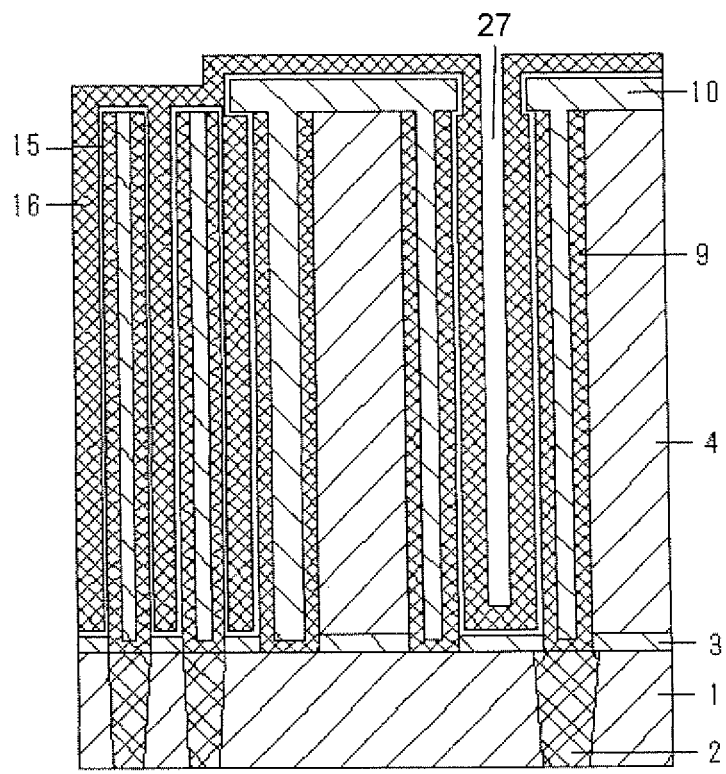
FIG. 8 is a diagram showing a step of the example of the method of manufacturing the semiconductor memory device according to the present invention.

Then, as shown in FIG. 8, dielectric film 15 was sequentially deposited all over the resulting surface. As a result, dielectric film 15 was formed to cover the surfaces of the lower electrodes in the memory cell portion forming region, while covering lower electrode 9 making up an inner wall of the third opening in the peripheral circuit portion forming region. Thereafter, TiN film 16 was deposited all over the resulting surface to a thickness of 10 nm to 30 nm. At this time, in the memory cell portion forming region, TiN was filled between the first insulating portions each formed with dielectric film 15 and lower electrode 9, to form upper electrode 16. At the same time, in the peripheral circuit portion forming region, a TiN film was deposited on the inner wall of the third opening so as to leave an opening portion unfilled, to form the upper electrode.

Figure 9:
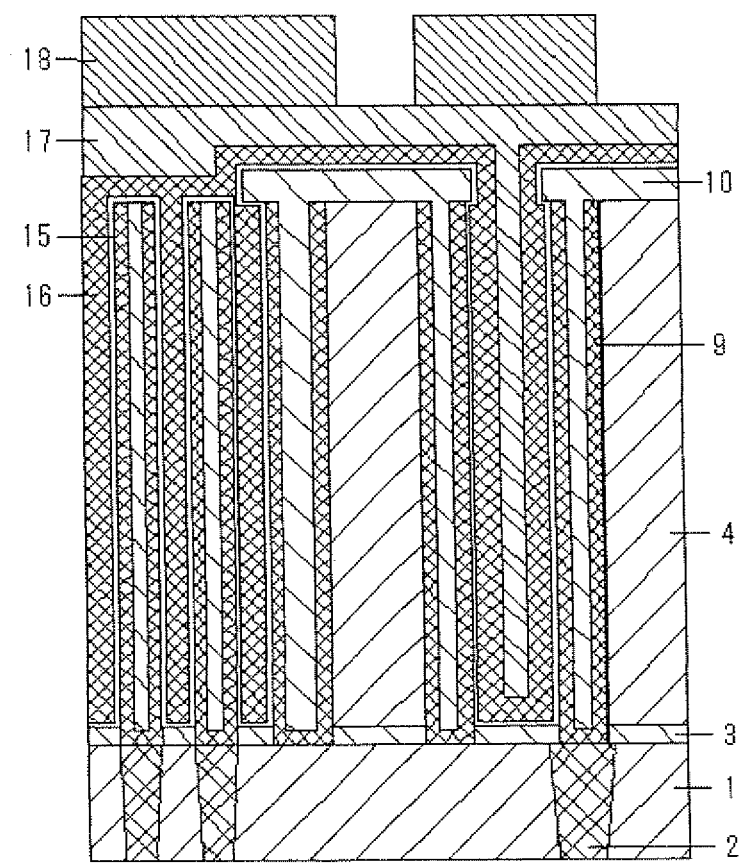
FIG. 9 is a diagram showing a step of the example of the method of manufacturing the semiconductor memory device according to the present invention.

Thereafter, as shown in FIG. 9, tungsten film 17 was deposited all over the resulting surface. As a result, in the memory cell portion forming region, plate electrode 17 was formed on upper electrode 16. In the peripheral circuit portion forming region, plate electrode 17 was formed so as to fill the opening portion of predetermined region 26. Photo resist pattern 18 with a predetermined pattern was thereafter formed on tungsten film 17.

Then, as shown in FIG. 10, plasma dry etching was performed through photo resist pattern 18 as a mask to process plate electrode 17 and upper electrode 16 so as to prevent the communication between plate electrode 17 and upper electrode 16, between the memory cell portion forming region and the peripheral circuit portion forming region.

Thus, the semiconductor memory device in the present example was successfully formed.

It is apparent that the present invention is not limited to the above embodiments, but may be modified and changed without departing from the scope and spirit of the invention.

What is claimed is:

1. A semiconductor memory device including a memory cell portion and a peripheral circuit portion,
    wherein the memory cell portion comprises:
        a first insulating portion extending in a predetermined direction;
        a capacitor including a lower electrode, a dielectric film, and an upper electrode sequentially formed on a side surface of the first insulating portion;
        a plate electrode electrically connected to the upper electrode; and
        a transistor including a source region and a drain region, one of which is electrically connected to the lower electrode, and
    the peripheral circuit portion comprises:
        a plate electrode extending in the same direction as the predetermined direction;
        a capacitor including an upper electrode, a dielectric film, and a lower electrode sequentially formed on a side surface of the plate electrode, the side surface of the plate electrode being parallel to the predetermined direction; and
        a transistor including a source region and a drain region, one of which is electrically connected to the lower electrode,
    wherein the memory cell portion comprises a plurality of arrays including a plurality of the first insulating portions each with the lower electrode and the dielectric film formed on the side surface thereof arranged at regular intervals in a particular direction,
    wherein the adjacent arrays are located such that the first insulating portions in one of the arrays are staggered with respect to the first insulating portions in the other array, and
    wherein the upper electrode is formed by filling a conductive material between the first insulating portions each formed with the lower electrode and the dielectric film.

2. The semiconductor memory device according to claim 1, wherein the first insulating portion is shaped like a cylinder.

3. The semiconductor memory device according to claim 1, wherein in the peripheral circuit portion, the plate electrode is shaped like a rectangular parallelepiped.

4. A semiconductor memory device including a memory cell portion, a peripheral circuit portion, and a boundary portion between the memory cell portion and the peripheral circuit portion,
    wherein the memory cell portion comprises:
        a first insulating portion extending in a predetermined direction;
        a capacitor including a lower electrode, a dielectric film, and an upper electrode sequentially formed on a side surface of the first insulating portion which is parallel to the predetermined direction;
        a plate electrode electrically connected to the upper electrode; and
        a transistor including a source region and a drain region, one of which is electrically connected to the lower electrode, and the peripheral circuit portion comprises:
        a plate electrode extending in the same direction as the predetermined direction;
        a capacitor including an upper electrode, a dielectric film, and a lower electrode sequentially formed on a side surface of the plate electrode which is parallel to the predetermined direction; and
        a transistor including a source region and a drain region, one of which is electrically connected to the lower electrode,
    wherein a boundary portion between the memory cell portion and the peripheral circuit portion includes a conductive material film formed on an inner wall of an opening extending in a same direction as the predetermined direction, and a second insulating portion filled in the opening.

5. A semiconductor memory device comprising:
    a memory cell portion including a plurality of first capacitors, each of the first capacitors including a first lower electrode formed along a first insulating wall, a first upper electrode, and a first dielectric film formed between the first lower electrode and the first upper electrode; and
    a peripheral circuit portion including at least one second capacitor, the second capacitor including a second lower electrode formed along a second insulating wall, a second upper electrode, and a second dielectric film formed between the second lower electrode and the second upper electrode,
    wherein the memory cell portion further includes a plurality of pillar insulating portions each protruding over a substrate, each of the first pillar insulating portions having a side surface to define the first insulating wall of an associated one of the first capacitors, and the peripheral circuit portion further includes an insulating layer over the substrate, the insulating layer having a first trench therein to define the second insulating wall of the second capacitor,
    wherein the insulating layer further has a second trench formed to surround the first trench, the second trench being filled with a conductive layer, and
    wherein the conductive layer is in contact with the second lower electrode.

6. The device as claimed in claim 5, wherein the first insulating wall is substantially equal in height to the second insulating wall.

7. The device as claimed in claim 5,
    wherein each of the first capacitors is of a pillar type in which a pillar insulating film protrudes over a substrate to define the first insulating wall, and the second capacitor is of a cylinder type in which an insulating film is formed over the substrate with a trench therein to define the second insulating wall.

8. The device as claimed in claim 7,
wherein the first lower electrode of each of the first capacitors is formed in a ring shape and the first upper electrode is shared by the plurality of the first capacitors, and
each of the second lower electrode and the second upper electrode of the second capacitor is formed in a ring shape.

9. The device as claimed in claim 5,
wherein each of the first capacitors is electrically connected between an associated one of memory cell transistors and a first plate electrode, and
the second capacitor being electrically connected between a peripheral transistor and a second plate electrode.

* * * * *